United States Patent
Sharma

(10) Patent No.: US 6,897,158 B2
(45) Date of Patent: May 24, 2005

(54) PROCESS FOR MAKING ANGLED FEATURES FOR NANOLITHOGRAPHY AND NANOIMPRINTING

(75) Inventor: Manish Sharma, Mountain Veiw, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 88 days.

(21) Appl. No.: 10/668,148

(22) Filed: Sep. 22, 2003

(65) Prior Publication Data

US 2005/0064720 A1 Mar. 24, 2005

(51) Int. Cl.[7] .............................................. H10L 21/461
(52) U.S. Cl. ...................... 438/713; 438/709; 438/712; 438/717
(58) Field of Search .............................. 438/713–708, 438/714–717, 706, 720–724

(56) References Cited

U.S. PATENT DOCUMENTS

| | | | |
|---|---|---|---|
| 5,948,470 A | | 9/1999 | Harrison et al. |
| 6,399,286 B1 | * | 6/2002 | Liu et al. ..................... 430/316 |
| 6,498,092 B2 | | 12/2002 | Lee et al. |
| 6,746,965 B2 | * | 6/2004 | Uehara et al. .............. 438/713 |
| 2004/0266179 A1 | * | 12/2004 | Sharma ....................... 438/673 |

OTHER PUBLICATIONS

Stephen Kitson and Adrian Geisow, "Controllable alignment of nematic liquid crystals around microscopic posts: Stabilizationof multiple states," Appl. Phys. Lett., pp. 3635–3637, vol. 80, No. 19, May 13, 2002.

* cited by examiner

*Primary Examiner*—Dung A. Le

(57) ABSTRACT

This invention provides a directional ion etching process for making nano-scaled angled features such as may be used, for example, in liquid crystal displays and or nanoimprinting templates. In a particular embodiment a semiconductor wafer substrate is prepared with at least one layer of material. A photoresist is applied, masked, exposed and developed. Anisotropic ion etching at a high angle relative to the wafer is performed to remove portions of the non protected material layer. The remaining photoresist caps shadow at least a portion of the material layer, and as the ion etching is performed at an angle, the protected portions of the material layer also appear at an angle.

39 Claims, 4 Drawing Sheets

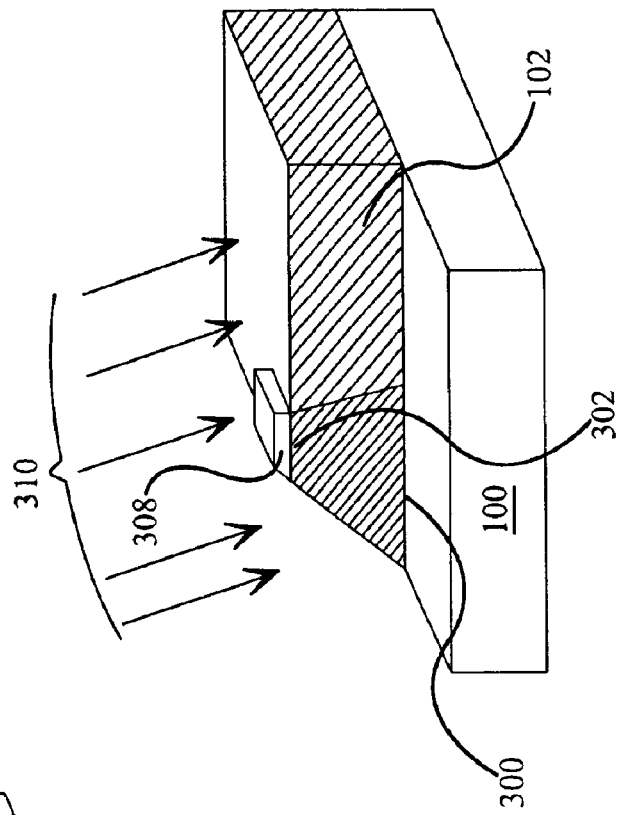
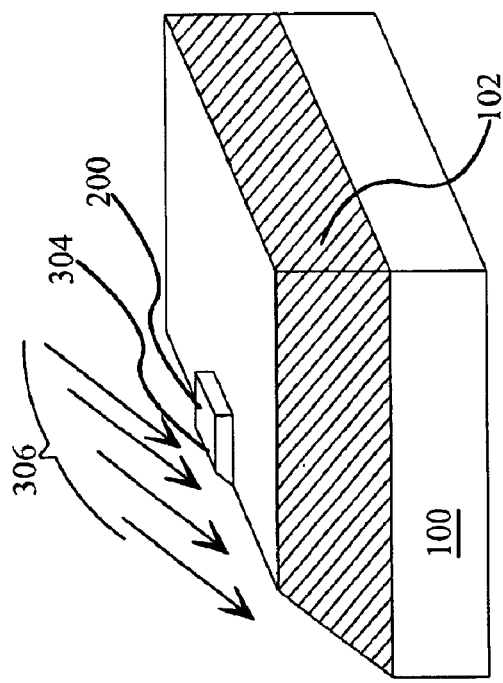

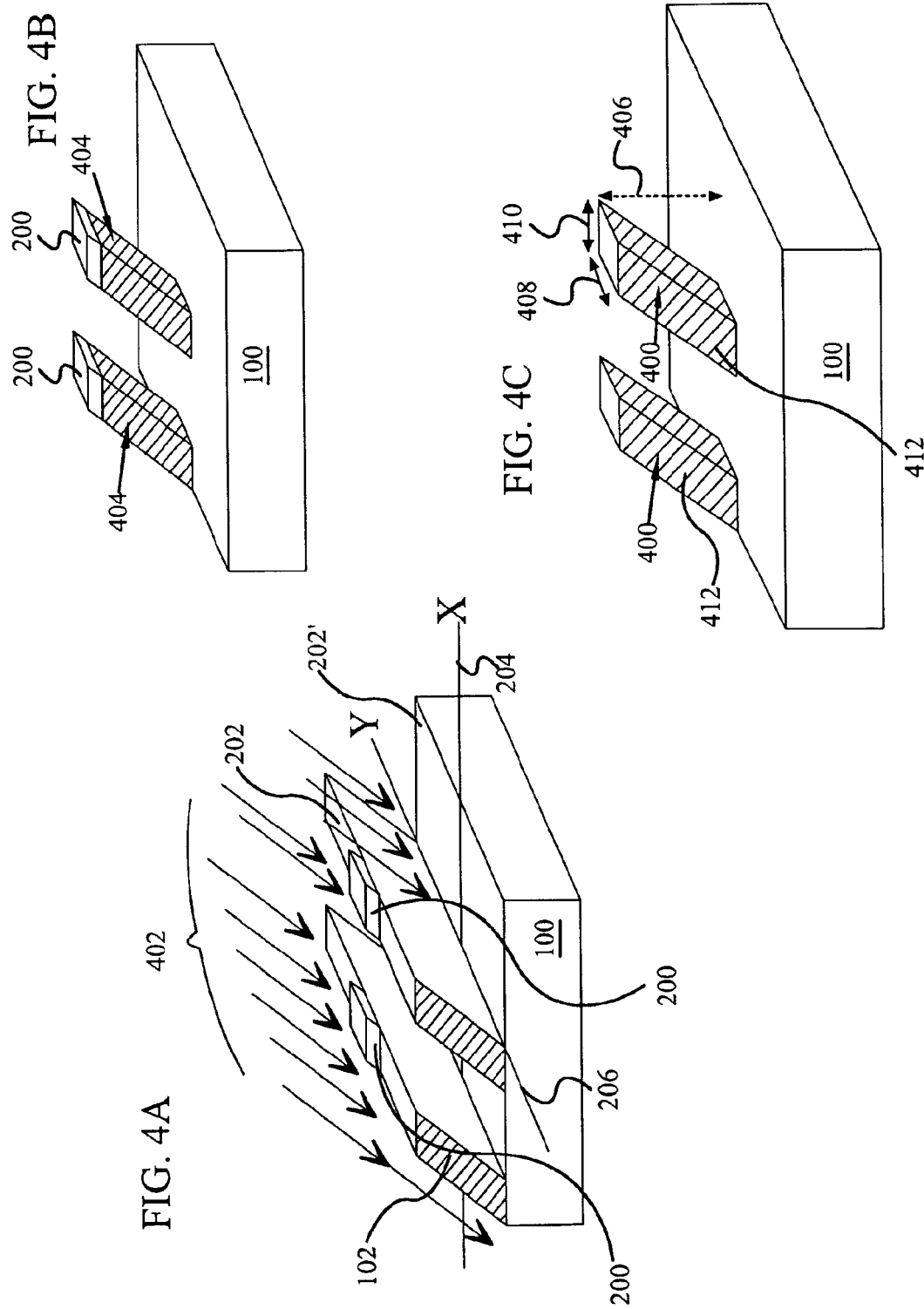

PROCESS FOR MAKING ANGLED FEATURES FOR NANOLITHOGRAPHY AND NANOIMPRINTING

FIELD OF THE INVENTION

This invention relates generally to the manufacture of semiconductor devices and in particular to an improved method of making angled pillars for nanolithography and/or nano imprinting.

BACKGROUND OF THE INVENTION

Traditional semiconductor fabrication techniques construct structures that are generally comprised of orthogonal elements. Transistors, conductors, isolators, or other structures may be visualized as a child's set of wooden building blocks. They may be placed one atop another and in appropriate cases may overlap, but when viewed from above, traditionally the top surfaces are visible while the perpendicular side surfaces are not.

While the widespread application of semiconductors exemplifies the functionality of perpendicular structures, there are known situations where the perpendicular structure is not ideal. At least two examples can be readily found with respect to liquid crystal displays and the mass production of precise nanometer scaled components.

Liquid crystal displays are growing in application as the costs of manufacturing decrease. Inherent in their growing popularity of application is also the improved ability to control polarization of the crystals comprising the display. Stated very simply, if a given crystal is polarized in one orientation it will reflect light differently then when it is polarized in a second orientation. Variations in the degree of polarization will result in variations of reflection as well.

In a typical liquid crystal display, the liquid crystal is disposed about a series of tiny pillars, the base of each being connected to a substrate that provides some form of selective electrical connectivity. When a given pillar is charged, it changes the local polarization of the liquid crystal about that pillar, The affect of the charge is most dramatic about the edges of the pillar. Much as with the example of viewing wooden blocks from above, the edges affecting the polarization of the crystal as it is viewed are the edges of the top surface of the pillar. The effect of the side surfaces is minimal as they are perpendicular and not exposed to top down viewing. While it has been understood that tilting the pillars would expose at least one side, and thereby increase the apparent polarization effect upon the crystal, difficulties in reducing pillar size and in achieving consistent precise angles have frustrated their production to date.

Throughout the history of manufacturing components in almost all cases the quality of production may be increased while costs are decreased when methods are found to simplify repetitive processes. With respect to semiconductors and nano-scaled components, the use of photolithography is well known. Generally speaking, a layer of material is set down on a substrate. A photo-resist layer, also commonly know simply as a photoresist, or even resist, is then applied typically with a spin coating machine. A mask is then placed over the photoresist and light, typically ultraviolet (UV) light, is applied. During the process of exposure, the photoresist undergoes a chemical reaction. Generally the photoresist will react in one of two ways. With a positive photoresist UV light changes the chemical structure of the photoresist so that it is soluble in a developer. What "shows" therefore goes, and the mask provides an exact copy of the pattern which is to remain. A negative photoresist behaves in the opposite manner—UV exposure causes it to polymerize and therefore photoresist dissolving by the developer. As such the mask is a photographic negative of the pattern to be left. Following the developing process "blocks" of photoresist remain. These blocks may be used to protect portions of the initial layer during further processing, may serve as isolators or other components.

In many cases, the defined structures achieved by the masked and developed photoresist are repeated many times across a given layer. The masking process and the developing process do have inherent error margins. Further, as the creation of a mask is typically complex and cost intensive, use of a single large mask to mask an entire substrate all at once may not be desired. As a result a smaller mask may be used repeatedly to achieve the affect of a single large mask, however, misalignment of the repeated maskings may waste material and/or result in an unusable wafer. In addition, the two steps of masking and developing are distinct and each may require separate devices and setup times.

To overcome some of these drawbacks, manufacturers have considered the use of nano-imprinting templates. Simply stated, a nano-imprinting template operates as a stamp, pressing three-dimensional structures into a semi soft polymer that retains a negative impression when the template is removed. As the structures provided on the template extend perpendicularly and are of a small scale, it is often difficult to affectively apply the template. Rotation of the template during application or removal is likely to damage the template and/or improperly skew the negative impression. As a result, great care must be employed to move the template in a plain directly parallel to the receiving polymer. Such movement requires that the surface tension and any inadvertent stiction or bonding between the template and the resist over the substrate be broken across the entire contacting surface at the same time. Any particulates incorporated into the resist or left behind on the template/stamp lead to eventual wearing out of the stamp and also defects in the printed resist. Thus, attention to the wear characteristics of the stamp is especially important since it is expected to be used repeatedly. While rolling the template into and out of the soft polymer would greatly reduce the stress imposed upon the surfaces, the ability to provide sufficiently strong, small and angled features upon a template has proven unreliable.

Attempts to fabricate angled features from traditional resist materials have involved either forming a "pillar" by stacking a series of smaller blocks one atop the other, each slightly offset, or exposing the photoresist at an angle so that developing occurs at an angle. In either case, the resultant pillar structures have been large, 0.4 to 0.5 microns across, and only slightly angled.

Hence, there is a need for a process of achieving angled features in nanolithography and nanoimprinting which overcomes one or more of the drawbacks identified above. The present invention satisfies one or more of these needs.

SUMMARY

This invention provides a directional ion etching process for making nano-scaled angled features.

In particular, and by way of example only, according to an embodiment of the present invention, this invention provides a directional ion etching process for making angled features including: depositing at least one layer of material upon a wafer substrate; depositing a photoresist upon the material layer; masking the photoresist to provide at least one area of photoresist protected material, the photoresist being developed to remove the photoresist from the non-protected area, thereby exposing at least one portion of the material layer; anisotropic ion etching about the remaining photoresist at a high angle relative to the wafer substrate to substantially remove the exposed portion of the material layer; removing the photoresist from the protected area thereby providing at least one angled feature of material.

Moreover, according to an embodiment thereof, the invention may provide a directional ion etching process for making angled features including: depositing a silicon/polymer layer upon a wafer substrate; depositing a photoresist upon the silicon/polymer layer; masking the photoresist to provide at least one area of photoresist protected silicon/polymer, the protected silicon/polymer having a plurality of sides defining the top at least one angled feature; developing the photoresist to remove the photoresist from the non-protected area, thereby exposing at least one portion of the siliconipolymer layer; anisotropic ion etching about the remaining photoresist at a high angle relative to the wafer substrate to substantially remove the exposed portion of the silicon polymer layer; removing the photoresist from the protected area thereby providing at least one angled feature of material.

In yet another embodiment, the invention may provide a directional ion etching process for making angled features in a nanoimprinting template for use with a soft polymer including: depositing at least one layer of undefined template material upon a wafer substrate; depositing a photoresist upon the undefined template material layer; masking the photoresist to provide a plurality of substantially identical photoresist protected areas, the photoresist being developed to remove the photoresist from the non-protected areas, thereby exposing and defining portions of the template layer; anisotropic reactive ion etching at a high angle relative to the wafer substrate to substantially remove the exposed portions of the template layer; and removing the photoresist from the protected area thereby providing a nanoimprinting template including a plurality of substantially identical angled features of template material, wherein the angle of the features facilitates insertion and extraction of the nanoimprinting template.

These and other objects, features and advantages of the preferred method and apparatus will become apparent from the following detailed description, taken in conjunction with the accompanying drawings which illustrate, by way of example the principles of the invention.

BRIEF DESCRIPTION OF THE DRAWINGS

FIGS. 3A–4A provide a perspective view illustrating anisotropic ion milling as may be performed upon the layered wafer of FIG. 1C;

FIGS. 4B–4C provide a perspective view illustrating the resulting angled features achieved from the layered wafer of FIG. 1C.

DETAILED DESCRIPTION

Figure 1A:
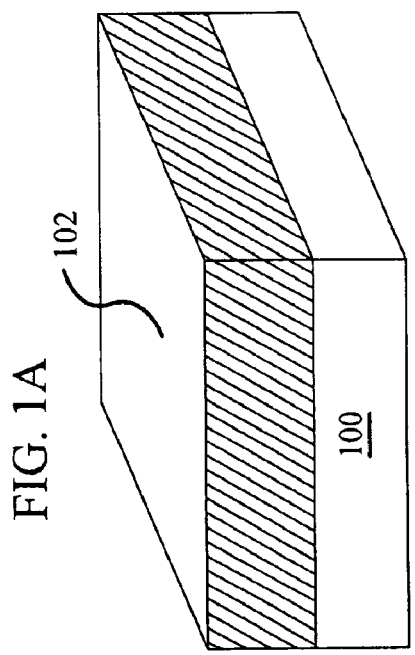
FIGS. 1A–1C provide a perspective view illustrating the application of material to a wafer in the process of fabricating angled features according to an embodiment of the present invention.
Figure 1C:
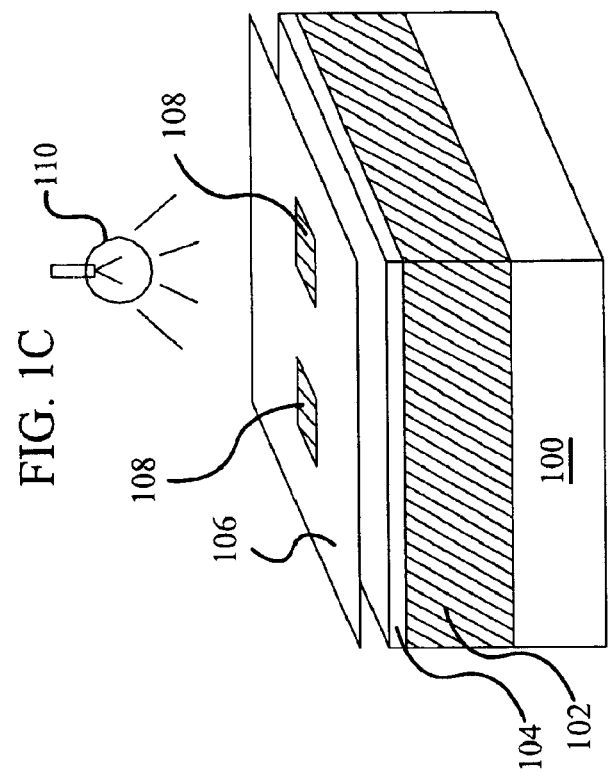

Before proceeding with the detailed description, it is to be appreciated that the present invention is not limited to use or application with a specific type of magnetic memory. Thus, although the present invention is, for the convenience of explanation, depicted and described with respect to typical exemplary embodiments, it will be appreciated that this invention may be applied with other types of magnetic memory.

Referring now to the drawings, FIGS. 1 through 4 conceptually illustrate an ion etching (also known as plasma etching) process for making angled features according to an embodiment of the present invention. It will be appreciated that the described process need not be performed in the order in which process for providing it is herein described, but that this description is merely exemplary of one preferred method of fabricating nano-scale angled features.

In at least one embodiment, the fabrication process may be commenced upon a semiconductor substrate wafer 100. Typically, the wafer 100 is chemically cleaned to remove any particulate matter, organic, ionic, and or metallic impurities or debris which may be present upon the surface of the wafer 100. In at least one embodiment, the wafer 100 may be flexible.

As shown in FIG. 1A, at least one layer of material 102 is deposited upon the wafer 100. The depositing of the material layer 102 may be by sputtering, ion beam deposition, electron beam evaporation, or such other appropriate method. In certain applications, the resulting angled features may be joined to a common conductor or placed atop conductive rows and/or column. In applications including such row and/or column placement, the process of photolithography may be used to provide these features prior to the depositing of the layer of material layer 102.

The material layer 102 may be a hard material, such as silicon or a polymer, herein referred to as silicon/polymer. A silicon/polymer is desired for strength. As noted above, orthogonal silicon pillars are generally desired for liquid crystal displays. In addition, the resiliency of silicon pillars is advantageous for a nanoimprinting template as, for example, they may be used repeatedly to stamp soft polymers without incurring significant wear. In at least one embodiment the hard dielectric material layer 102 is selected from the group consisting of silicon, silicon dioxide, silicon carbon, and silicon nitride.

With respect to the fabrication of a nanoimprinting template, the material layer 102 may be considered the template material. Further, the template material may generally be selected to be compatible with the soft polymer the template will ultimately be stamped against. In this regard, the issue of compatibility is understood and appreciated to imply that the template material will not significantly adhere to the soft polymer. Moreover, the insertion and extraction of the template provides consistent imprinting with minimal deformation of the imprinting due to adhesion, surface tension, other attractive forces, or the formation and/or accumulation of any debris or particulates between the template material and the soft polymer.

Figure 1B:
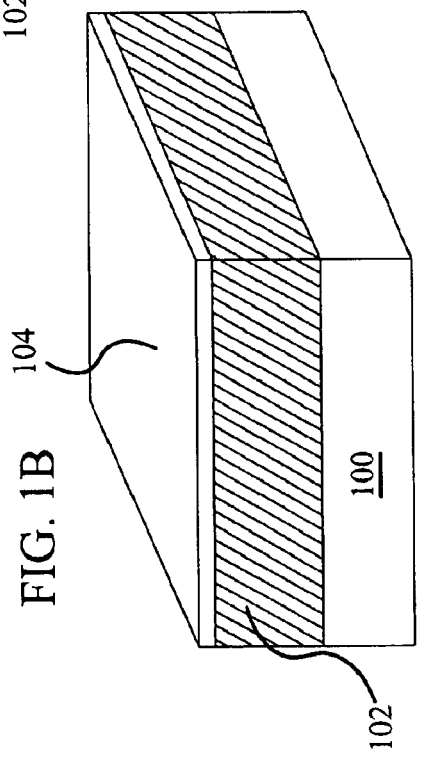

As shown in FIG. 1B, a layer of photoresist 104 is applied upon the material layer 102. In at least one embodiment the photoresist 104 is a positive photoresist. Application of the photoresist may be by the technique commonly known as "spin coating." Briefly stated, the wafer 100 is placed in a high-speed centrifuge also providing a vacuum environment. Rotated at a speed of between 3000 to 6000 RPM a small quantity of photoresist is deposited at the center of the spinning wafer 100. The rotation causes the photoresist to spread out across the wafer 100 in a substantially uniform thickness. Generally the wafer 100 is then baked gently in an oven to evaporate the photoresist solvents and partially solidify the photoresist.

A photo mask is created by known photographic methods upon a glass substrate, thus providing a mask 106. The mask is aligned with the wafer 100 so that the pattern 108 may be transferred on to the surface of the photoresist 104, see FIG. 1C. Following alignment of the mask 106, the photoresist is exposed through the pattern 108 on the mask 106 with a high intensity light 110. The wavelength of the light used is dependent upon the resolution of the structures to be produced upon the wafer. The light may be visible light, ultra-violet (UV), deep-UV (DUV), extreme-UV (EUV), or even X-ray. There are generally understood to be three primary methods of exposure: contact, where the mask 106 is placed in direct contact with the surface of the photoresist 104; proximity, where the mask 106 is placed in close proximity, 10 to 25 microns, to the photoresist; and projection, where the mask is projected upon the photoresist from a greater distance. Such projection exposure may be desired as it reduces the possible damage to the mask 106 from contact or proximity exposure, and more significantly permits very small resolution allowing for nanometer scaled production work.

Figure 2A:
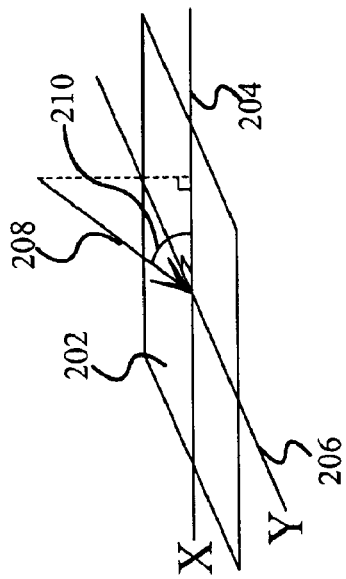
FIGS. 2A–2C provide a perspective view illustrating protective photoresist caps and relative ion milling angles for the layered wafer of FIG. 1C.

With a positive resist, the exposed portions of photoresist 104 become soluble to a developer. As shown in FIG. 2A, the developing process removes the soluble portion of the photoresist 104 from the non-protected areas, and results in remaining photoresist caps 200 patterned to protect areas of the material layer 102. Although for the sake of simplicity these photoresist caps 200 have been illustrated as having four sides, the remaining photoresist caps 200 may have a plurality of sides. In at least one embodiment the remaining photoresist caps 200 may be substantially circular. Generally, the wafer may be baked to harden the remaining photoresist caps 200.

The sides of the remaining photoresist caps 200 substantially define the shape of the top of the angled features to be produced. Further the sides of the remaining photoresist caps 200 define guides for the anisotropic ion etching. In addition, of the plurality of sides of a remaining photoresist cap 200, any two opposing sides may be substantially parallel.

The angled features 400 shown in FIG. 4C are achieved by anisotropic ion etching about the remaining photoresist caps 200 at an angle, more specifically a high angle relative to the wafer 100. Additionally, each angle of etching along each side may be different for each of the plurality of sides. In a typical ion etching process the wafer 100 rotates throughout the ion beam. In the anisotropic process, the wafer 100 does not rotate. Rather, relative to the wafer 100, the ion beam travels laterally across the wafer 100. By not rotating the wafer 100, different angles of the ion beam relative to the wafer 100 for each of the plurality of sides of the remaining photoresist caps 200 are permitted.

Figure 2B:
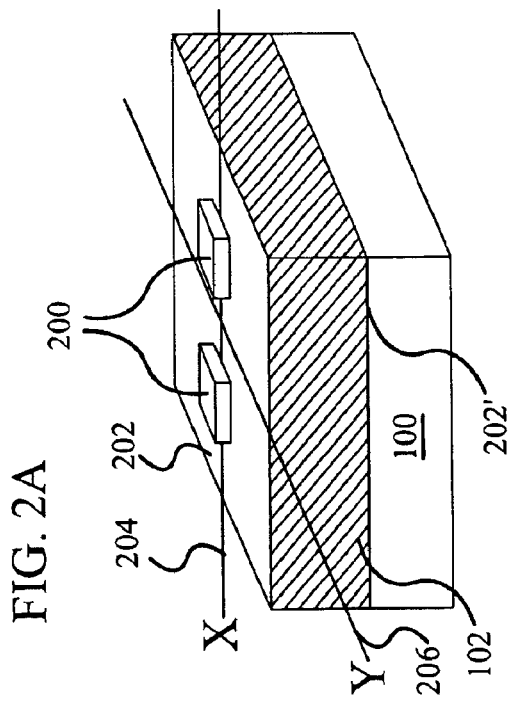

To aid in purposes of discussion, the wafer 100 may be considered to have a two perpendicular axis parallel to the surface 202, an X axis 204 and a Y axis 206. Surface 202 is parallel to the top surface 202' of wafer 100. In addition, the relative angle of the ion beam 208 to the surface 202 may be relative to one or both axis 204 and 206. More specifically, as shown in FIG. 2B, the ion beam 208 is shown at a high angle 210 relative to the X axis 204 (and the surface 202) and substantially perpendicular to the Y axis 206.

Figure 2C:
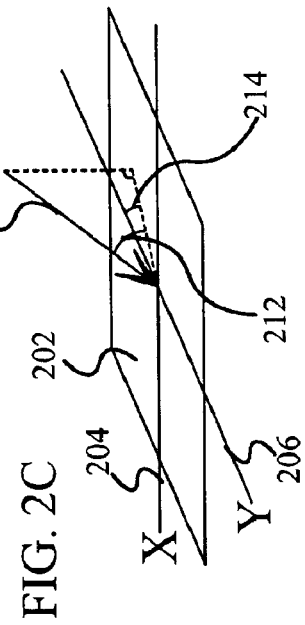

With respect to FIG. 2C, the ion beam 208 is shown again with a high angle relative to the surface 202, however there is both an X axis component 212 and a Y axis component 214. In at least one embodiment the high angle of the ion beam 208 relative to the wafer 100 is achieved by substantially tilting the wafer 100 as it is presented to the ion etching beam. In at least one alternative embodiment, the high angle of the ion beam 208 relative to the wafer 100 is achieved by substantially tilting the ion beam 208 as it is presented to the wafer 100.

It is generally understood that an ion etching process may be accomplished by either of two traditional processes, a physical process or an assisted physical process. In a physical etching environment no chemical agent is provided. Rather, the removal of material is entirely dependent upon the physical impact of the ions knocking atoms off the material surface by physical force alone. Physical ion etching is commonly referred to as ion milling or ion beam etching.

In an assisted physical process such as a reactive ion etching process, or RIE, removal of material comes as a combined result of chemical reactions and physical impact. Generally the ions are accelerated by a voltage applied in a vacuum. The affect of their impact is aided by the introduction of a chemical which reacts with the surface of the semiconductor being etched. The reaction makes the surface softer and as such increases both the relative control of the etching as well as the etching rate. An RIE process advantageously permits very accurate etching of the material layer 102. Specific selection of different materials further permits an RIE process to soften one layer without significantly softening another. Advantageously the softening of the material layer 102 induced by the RIE process allows for substantially precise removal of exposed portions of the material layer without substantially significant etching of the underlying wafer substrate. In addition the RIE process permits anisotropic etching at angles substantially approaching 60 degrees relative to the surface 202' of the wafer 100.

In at least one embodiment the anisotropic ion etching to remove the exposed portions of the material layer 102 is by an assisted physical process such as RIE. The type of directed ions used for both methods, and the type of chemical(s) assistant in REI, may very depending upon the nature of the material being removed.

In at least one embodiment the anisotropic ion etching process advantageously permits the formation of angled features having a base 300 proximate to the wafer and a top 302 opposite from the base wherein the top 302 is smaller than the base 300, see FIG. 3B. Such tapering of the angled features may facilitate insertion and extraction when such angled features are part of a nanoimprinting template.

FIGS. 3A and 3B further illustrate the anisotropic ion milling process. More specifically, ion etching is performed substantially along the first side 304 of the remaining photoresist cap 200 at a first angle with ion beam 306. Ion etching is then performed substantially along the second side 308 of the remaining photoresist cap 200 at a second angle with ion beam 310. With respect to the four sided photoresist as shown, ion etching is performed substantially along the third side of the remaining photoresist at a third angle and then again substantially along the fourth side at a fourth angle.

A plurality of angled features may also be easily achieved. As shown in FIG. 4A, an ion beam 402 may be passed laterally across wafer 100, parallel to the Y axis 206, and at precise interval spacing along the X axis 204. As shown in FIGS. 3A and 3B, the ion beam 402 removes the portions of the material layer not protected by the remaining photoresist caps 200. In at lest one embodiment the features are substantially identical.

In effect, the remaining photoresist caps 200 shadow at least a portion of the material layer 102. As the ion beam 402 is emanating from a source that is generally not directly perpendicular to the surface 202 or 202', the protective shadow is angled. As the ion beam removes exposed portions of the material layer 102, the affect of the protective angled shadow is realized as angled features 400 (see FIG. 4C) comprised of remaining angled material 404 shown in FIG. 4B. Although shown as substantially square for the purposes of simple visual representation, in at least one embodiment the angled feature or features may be cylindrical.

Upon completion of the anisotropic ion milling process, the remaining photoresist caps 200, shown in FIG. 4B, may be dissolved or otherwise removed. With the remaining photoresist removed the final angled features 400 of material result as shown in FIG. 4C. In at least one embodiment the resultant angled feature 400 may be a silicon pillar. It is also appreciated that the anisotropic ion milling may be performed upon a material layer 102 which is in actuality a patterned layer, or a series of multiple patterned and conductive layers as may be used in the formation of magnetic tunnel junction memory cells or vertical transistors.

It is easily appreciated that the height 406 of the angled features 400 may be quite large. The length 408 and width 410 dimensions are generally limited by the photolithography processes. However, the aspect ratio of the height 406 to the length 408 or width 410 may be substantially between 2 and 30. These rations are desired. As described above with respect to liquid crystal displays, the polarization of the liquid crystal is most dramatic about the edges of a pillar, and as the sides of prior art pillars are generally perpendicular they contribute little to the polarization affect. As the angling of the angled feature 400 exposes one or more sides 412 when viewed from above, the apparent polarization affect upon the crystal is increased. With respect to the making of angled features for a nanoimprinting template, the angle of angled features 400 may be selected to facilitate repeated insertion and extraction of the nanoimprinting template.

With respect to appropriate circumstances, such as the fabrication of a nanoimprinting template desired for the primary purpose of stamping, the method of fabrication may not require the depositing of the material layer 102. More specifically, the wafer 100 may be a substantially bare silicon wafer of sufficient thickness that the wafer itself may undergo anisotropic etching. Under such appropriate circumstances, the photoresist 104 may be deposited directly upon the silicon wafer. Application of the mask 106, exposure and development may occur as described above. The resulting photoresist caps are then used to shadow portions of the silicon wafer as described above. The anisotropic milling process then removes at least a portion of the exposed portion of the wafer, and removal of the photoresist caps will result in at least one angled feature. Use of such a silicon wafer with direct application of the photoresist may be particularly advantageous in the fabrication of a nanoimprinting template.

While the invention has been described with reference to the preferred embodiment, it will be understood by those skilled in the art that various alterations, changes and improvements may be made and equivalents may be substituted for the elements thereof and steps thereof without departing from the scope of the present invention. In addition, many modifications may be made to adapt to a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode contemplated for carrying out this invention, but that the invention will include all embodiments falling within the scope of the appended claims.

I claim:

1. A directional ion etching process for making angled features comprising:

providing a wafer substrate;

depositing a photoresist upon the wafer substrate;

masking the photoresist to provide at least one area of photoresist protected wafer substrate, the photoresist being developed to remove the photoresist from the non-protected area, thereby exposing at least one portion of the wafer substrate;

anisotropic ion etching about the remaining photoresist at a high angle relative to the wafer substrate to substantially remove at least a portion of the exposed portion of the wafer substrate;

removing the photoresist the photoresist from the protected area thereby providing at least one angled feature of material.

2. The process of claim 1, wherein the wafer is a silicon wafer.

3. The process of claim 1, further including depositing at least one layer of material upon the wafer substrate prior to depositing the photoresist.

4. A directional ion etching process for making angled features comprising:

depositing at least one layer of material upon a wafer substrate;

depositing a photoresist upon the material layer;

masking the photoresist to provide at least one area of photoresist protected material, the photoresist being developed to remove the photoresist from the non-protected area, thereby exposing at least one portion of the material layer;

anisotropic ion etching about the remaining photoresist at a high angle relative to the wafer substrate to substantially remove the exposed portion of the material layer;

removing the photoresist from the protected area thereby providing at least one angled feature of material.

5. The process of claim 4, wherein the material layer is a hard material.

6. The process of claim 5, wherein the hard material is selected from the group consisting of Silicon, Silicon Dioxide, Silicon Carbon, Silicon Nitride.

7. The process of claim 4, wherein the ion etching is accomplished by RIE.

8. The process of claim 4, wherein the angled feature is characterized by a length, a width and a height, the aspect ratio of the height to the length or width being substantially between 2 and 30.

9. The process of claim 4, wherein the at least one angled feature is cylindrical.

10. The process of claim 4, wherein the at least one angled feature is further characterized as having a base proximate to the wafer substrate and a top opposite from the base, the top being smaller than the base.

11. The process of claim 4, wherein prior to removal the remaining photoresist has a plurality of sides, the sides substantially defining the shape of the top of the angled feature, the sides further defining guides for the anisotropic ion etching.

12. The process of claim 11, wherein of the plurality of sides any two opposing sides may be substantially parallel.

13. The process of claim 11, wherein the etching angle for each side of the photoresist protected material is substantially between about 90 to 60 degrees relative to the surface of the wafer substrate.

14. The process of claim 11, wherein the anisotropic ion etching process comprises:
ion etching along substantially each side of the remaining photoresist at an angle, wherein the angle of etching may be different for each of the plurality of sides.

15. The process of claim 4, wherein the high angle relative to the wafer substrate is achieved by substantially tilting the wafer substrate as it is presented to an ion etching beam.

16. The process of claim 4, wherein the high angle relative to the wafer substrate is achieved by substantially tilting an ion etching beam as it is presented to the wafer substrate.

17. The process of claim 4, wherein the at least one provided angled feature is a silicon pillar.

18. The process of claim 4, wherein the deposited material is a patterned layer.

19. The process of claim 4, wherein the deposited material further comprises multiple patterned layers and conductive layers.

20. The process of claim 4, wherein the at least one provided angled feature is a vertical transistor.

21. A directional ion etching process for making angled features comprising:
depositing a silicon/polymer layer upon a wafer substrate;
depositing a photoresist upon the silicon/polymer layer;
masking the photoresist to provide at least one area of photoresist protected silicon/polymer, the protected silicon/polymer having a plurality of sides defining the top at least one angled feature;
developing the photoresist to remove the photoresist from the non-protected area, thereby exposing at least one portion of the silicon/polymer layer;
anisotropic ion etching about the remaining photoresist at a high angle relative to the wafer substrate to substantially remove the exposed portion of the silicon/polymer layer;
removing the photoresist from the protected area thereby providing at least one angled feature of material.

22. The process of claim 21, wherein the silicon/polymer is selected from the group consisting of Silicon, Silicon Dioxide, Silicon Carbon, Silicon Nitride.

23. The process of claim 21, wherein the ion etching is accomplished by RIE.

24. The process of claim 21, wherein the at least one angled feature is cylindrical.

25. The process of claim 21, wherein the at least one angled feature is further characterized as having a base proximate to the wafer substrate and a top opposite from the base, the top being smaller than the base.

26. The process of claim 21, wherein prior to removal the remaining photoresist has a plurality of sides, the sides substantially defining the shape of the top of the angled feature, the sides further defining guides for the anisotropic ion etching.

27. The process of claim 26, wherein of the plurality of sides any two opposing sides may be substantially parallel.

28. The process of claim 26, wherein the anisotropic ion etching process comprises:
ion etching along substantially each side of the remaining photoresist at an angle, wherein the angle of etching may be different for each of the plurality of sides.

29. The process of claim 26, wherein plurality of sides equals four, the anisotropic ion etching process comprises:
ion etching along substantially the first side of the remaining photoresist at a first angle;
ion etching along substantially the second side of the remaining photoresist at a second angle;
ion etching along substantially the third side of the remaining photoresist at a third angle; and
ion etching along substantially the fourth side of the remaining photoresist at a fourth angle.

30. The process of claim 21, wherein the wafer substrate is flexible.

31. A directional ion etching process for making angled features in a nanoimprinting template for use with a soft polymer comprising:
depositing at least one layer of undefined template material upon a wafer substrate;
depositing a photoresist upon the undefined template material layer;
masking the photoresist to provide a plurality of substantially identical photoresist protected areas, the photoresist being developed to remove the photoresist from the non-protected areas, thereby exposing and defining portions of the template layer;
anisotropic reactive ion etching at a high angle relative to the wafer substrate to substantially remove the exposed portions of the template layer; and
removing the photoresist from the protected area thereby providing a nanoimprinting template including a plurality of substantially identical angled features of template material,
wherein the angle of the features facilitates insertion and extraction of the nanoimprinting template.

32. The process of claim 31, wherein the wafer substrate is flexible.

33. The process of claim 31, wherein the template material is selected to be compatible with the soft polymer.

34. The process of claim 31, wherein the silicon/polymer is selected from the group consisting of Silicon, Silicon Dioxide, Silicon Carbon, Silicon Nitride.

35. The process of claim 31, wherein the at least one angled feature is cylindrical.

36. The process of claim 31, wherein the at least one angled feature is further characterized as having a base proximate to the wafer substrate and a top opposite from the base, the top being smaller than the base.

37. The process of claim 31, wherein prior to removal the remaining photoresist has a plurality of sides, the sides substantially defining the shape of the top of the angled feature, the sides further defining guides for the anisotropic ion etching.

38. The process of claim 37, wherein of the plurality of sides any two opposing sides may be substantially parallel.

39. The process of claim 37, wherein the reactive anisotropic ion etching process comprises:
ion etching along substantially each side of the remaining photoresist at an angle, wherein the angle of etching may be different for each of the plurality of sides.

* * * * *